(12) United States Patent
Kashyap (10) Patent No.: US 7,386,021 B2
(45) Date of Patent: Jun. 10, 2008

(54) LIGHT SOURCE

(76) Inventor: Raman Kashyap, 110, Elm Crescent, Baie d'Urfé, Quebec (CA) H9X 2P6

(*) Notice: Subject to any disclaimer, the term of this patent is extended or adjusted under 35 U.S.C. 154(b) by 61 days.

(21) Appl. No.: 11/437,791

(22) Filed: May 22, 2006

(65) Prior Publication Data

US 2007/0064756 A1    Mar. 22, 2007

Related U.S. Application Data (60) Provisional application No. 60/683,348, filed on May 23, 2005.

(51) Int. Cl.
*H01S 3/04* (2006.01)
(52) U.S. Cl. .................. 372/34; 372/102; 372/21; 372/22
(58) Field of Classification Search .......... 372/21, 372/22, 34
See application file for complete search history.

(56) References Cited

U.S. PATENT DOCUMENTS

| 5,937,120 A * | 8/1999 | Higashi ............... 385/49 |
| 6,021,141 A | 2/2000 | Nam et al. |
| 6,125,129 A | 9/2000 | Naegele et al. |
| 6,996,140 B2 | 2/2006 | Waarts et al. |
| 2003/0198434 A1 | 10/2003 | Lachance et al. |

FOREIGN PATENT DOCUMENTS

JP    2005-64109    * 3/2005

* cited by examiner

*Primary Examiner*—Dung (Michael) T. Nguyen (57) ABSTRACT

In a first broad aspect, the invention provides a light source. The light source includes a semiconductor laser for emitting laser light at a first frequency. The light source also includes an optical fibre that includes a fibre Bragg grating. The fibre Bragg grating is optically coupled to the semiconductor laser for receiving the laser light, reflecting a reflected portion of the laser light towards the laser and allowing the transmitted portion of the laser light to pass through the fibre Bragg grating. The fibre Bragg grating has a temperature-dependant reflection spectrum. A frequency converting optical element is optically coupled to the fibre Bragg grating for receiving the transmitted portion of the laser light and converting at least a fraction of the transmitted portion of the laser light into a converted light having a second frequency different from the first frequency. An output port is optically coupled to the frequency converting optical element for outputting the converted light. A temperature controller is thermally coupled to the fibre Bragg grating for modulating a temperature of the fibre Bragg grating so as to modulate the reflection spectrum.

20 Claims, 6 Drawing Sheets

LIGHT SOURCE

This application claims priority from U.S. Provisional Patent Application Ser. No. 60/683,348 filed May 23, 2005.

FIELD OF THE INVENTION

The present invention relates generally to the field of optics and is particularly concerned with a light source.

BACKGROUND OF THE INVENTION

The present invention relates generally to the field of optics

There are many instances wherein it is desirable that the frequency of a laser be changed to another frequency, often a harmonic of the frequency of the laser. For example, many frequencies, such as, for example, visible frequencies, are relatively hard to produce using inexpensive lasers. Thus, to obtain such a visible frequency, an infrared laser beam is directed onto a material that has non-linear optical properties. When the laser beam arrives into the material, harmonics are generated so that the frequency of the laser is converted to a converted beam having an higher frequency.

One problem that occurs in this type of device is that the phase constant of the converted beam has to be the same as the phase constant of the incident beam throughout the material so that conversion is efficient. If the material is relatively long, so as to allow a relatively large conversion, this condition may be hard to achieve, as it requires a relatively narrow bandwidth incident laser light.

Another problem that occurs in many such devices is that these devices often include relatively large optical elements, such as lenses, which therefore prevent manufacturing relatively compact light sources.

Furthermore, there is often a need to control the temperature of the elements included in a wavelength conversion device. Temperature is typically controlled using a plurality of temperature controllers, each coupled to a different component. The use of many temperature controllers increases the size of the device and reduces its energy efficiency.

Accordingly, there exists a need for an improved light source.

It is a general object of the present invention to provide such a light source.

SUMMARY OF THE INVENTION

In a first broad aspect, the invention provides a light source. The light source includes a semiconductor laser for emitting laser light at a first frequency. The light source also includes an optical fibre that includes a fibre Bragg grating. The fibre Bragg grating is optically coupled to the semiconductor laser for receiving the laser light, reflecting a reflected portion of the laser light towards the laser and allowing the transmitted portion of the laser light to pass through the fibre Bragg grating. The fibre Bragg grating has a temperature-dependant reflection spectrum. A frequency converting optical element is optically coupled to the fibre Bragg grating for receiving the transmitted portion of the laser light and converting at least a fraction of the transmitted portion of the laser light into a converted light having a second frequency different from the first frequency. An output port is optically coupled to the frequency converting optical element for outputting the converted light. A temperature controller is thermally coupled to the fibre Bragg grating for modulating a temperature of the fibre Bragg grating so as to modulate the reflection spectrum.

In some embodiments of the invention, the temperature of the fibre Bragg grating is adjusted by the temperature controller so as to obtain a predetermined reflection spectrum into the fibre Bragg grating. Adjusting the temperature of the fibre Bragg grating therefore adjusts the frequency at the output of the fibre Bragg grating so as to improve the efficiency of conversion from the frequency converting optical element.

In some embodiments of the invention, the fibre Bragg grating has a reflection spectrum having a relatively narrow bandwidth and the optical fibre has properties resulting in a relatively narrow linewidth operation of the semiconductor laser and fibre Bragg grating assembly.

In some embodiments of the invention, the temperature controller includes a heat pump to which at least some of the components of the light source are thermally coupled so that a single heat pump may modulate, regulate or control the temperature of all the components of the light source.

The light source is relatively simple and inexpensive to manufacture. Furthermore, the light source is relatively energy efficient in converting power to laser light and allows for the production of relatively powerful converted light beams. Furthermore, the light source is relatively compact.

Other objects, advantages and features of the present invention will become more apparent upon reading of the following non-restrictive description of preferred embodiments thereof, given by way of example only with reference to the accompanying drawings.

BRIEF DESCRIPTION OF THE DRAWINGS

An embodiment of the present invention will now be disclosed, by way of example, in reference to the following drawings in which:

FIG. 9, in cross-sectional view along the line IX-IX of FIG. 8, illustrates the light source of FIG. 8.

DETAILED DESCRIPTION

Figure 1:
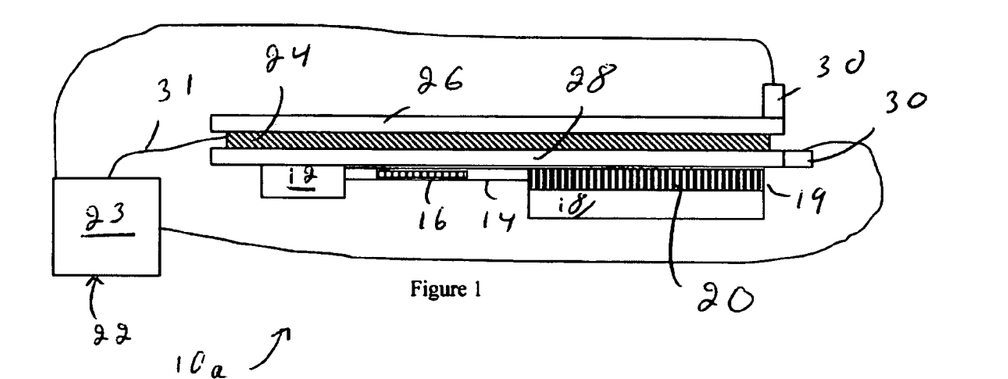
FIG. 1, in a schematic view, illustrates a light source in accordance with an embodiment of the present invention.

FIG. 1 illustrates a light source 10*a* in accordance with an embodiment of the present invention. The light source 10*a* uses frequency conversion to convert light coming from a semiconductor laser 12 at a first frequency into light having a second frequency differing from the first frequency.

The light source 10a includes the semiconductor laser 12 for emitting laser light at the first frequency. The light source 10a further includes an optical fibre 14 including a fibre Bragg grating 16. The fibre Bragg grating 16 is optically coupled to the semiconductor laser 12 for receiving the laser light, reflecting a reflected portion of the laser light towards the semiconductor laser 12 and allowing a transmitted portion of the laser light to pass through the fibre Bragg grating 16. The semiconductor laser 12, the optical fibre 14 and the fibre Bragg grating 16 together form a source of laser light.

This laser light is injected into a frequency converting optical element 18 optically coupled to the fibre Bragg grating 16 for receiving the transmitted portion of the laser light and converting at least a fraction of this transmitted portion of the laser light into a converted light having the second frequency. An output port 19 is optically coupled to the frequency converting optical element 18 for outputting the converted light.

A temperature controller 22 is thermally coupled to the fibre Bragg grating 16 for modulating a temperature of the fibre Bragg grating 16. For example, the fibre Bragg grating 16 has a temperature dependent reflection spectrum. The temperature controller 22 is then provided for modulating the temperature of the fibre Bragg grating 16 so as to modulate the reflection spectrum.

In a variant, an intended user may modulate the temperature of the fibre Bragg grating 16 while observing the spectrum, intensity or both the spectrum and intensity of the converted light beam. Upon the spectrum, the intensity or both the spectrum and intensity of the converted light beam satisfying a predetermined criterion, the temperature of the fibre Bragg grating is maintained so that the predetermined criterion remains satisfied.

In another variant, the temperature controller 22 modulates the temperature of the fibre Bragg grating 16 so as to adjust the temperature of the fibre Bragg grating 16 to obtain a predetermined reflection spectrum. In this embodiment, the temperature of the fibre Bragg grating 16 is a predetermined temperature.

In some embodiments of the invention, the predetermined reflection spectrum is such that conversion from the fraction of the transmitted portion of the laser light to the converter light is relatively efficient.

In some embodiments of the invention, the frequency converting optical element 18 includes a non-linear material for converting the fraction of the transmitted portion of the laser light into the converted light. In these embodiments, the second frequency is a harmonic of the first frequency. For example, the second frequency is about twice the first frequency.

A suitable frequency converting optical element 18 includes a non-linear periodically poled waveguide 20 formed into a crystal. However, as described in further details hereinbelow, the frequency converting optical element 18 may be any other suitable frequency converting optical element. For example, and non-limitingly, the frequency converting optical element includes any other non-linear material. In another example, the frequency converting optical element 18 includes a semiconductor laser.

In many conventional instances wherein a semiconductor laser 12 is coupled to a fibre Bragg grating 16 for regulating a lasing frequency of the semiconductor 12, the fibre Bragg grating has a relatively low reflectivity and is located at a relatively large distance from the semiconductor laser 12. In addition, the fibre Bragg gratings in such systems are relatively short and, therefore, have a relatively wide reflection bandwidth.

To the contrary, in the present invention, the fibre Bragg grating 16 is located relatively close to the semiconductor laser 12. For example, it has been found that positioning the fibre Bragg grating 16 at a distance smaller than about 10 mm from the semiconductor laser 12 produces laser light having properties suitable for use with the present invention. In other words, a resonant cavity formed by the optical fibre 14 between the fibre Bragg grating 16 and the semiconductor laser 12 having a cavity length of less than about 10 mm produces these results.

In addition, the fibre Bragg grating 16 has a reflectivity larger than about 30%. Yet, furthermore, the fibre Bragg grating 16 has a relatively narrow reflection bandwidth, for example, less than about 0.3 nm. In some embodiments of the invention, the fibre Bragg grating 16 and the semiconductor laser 12 produce laser light having a bandwidth of less than about 0.01 nm.

In some embodiments of the invention, the optical fibre 14 is a polarization maintaining optical fibre. In these embodiments, it is therefore possible to obtain polarized light at the output port 19. In these embodiments, aligning the polarization axis of the optical fibre ensures that only one frequency is transmitted into the frequency converting optical element 18.

Indeed, polarization maintaining fibres include a birefringent material. Since the reflection spectrum of the fiber Bragg grating 16 depends on the refractive index of the material in which the fiber Bragg grating 16 is formed, if the polarization axis of the fiber were not carefully aligned, light having two different frequencies and polarizations would be transmitted into the frequency converting optical element 18.

In some embodiments of the invention, the output port 19 includes an external surface of the periodically poled optical waveguide 20 located opposed to the optical fiber 14. However, in alternative embodiments of the invention, the output port 19 includes any other suitable optical components for outputting the frequency converted light.

The optical fibre 14 is fused to the frequency converting optical element 18 and to the semiconductor laser 12. In alternative embodiments, the optical element 18 and the semiconductor laser 12 is glued or welded to the semiconductor laser 12 and to the frequency converting optical element 18. Therefore, light is transmitted relatively efficiently between the laser 12, the optical fibre 14 and the frequency converting optical element 18. However, the fibre Bragg grating 16 may be optically coupled to the frequency converting optical element 18 and to the semiconductor laser 12 in any other suitable manner. A few examples of such manners of optically coupling the fibre Bragg grating 16 to the frequency converting optical element 18 and the semiconductor laser 12 are described in further details hereinbelow.

The semiconductor laser 12 often needs to be temperature stabilized to ensure proper operation at relatively high power output. Furthermore, frequency converting optical elements are typically temperature dependent in their conversion efficiency. Typically, sensitivity to temperature and differing temperature requirements for semiconductor lasers, fibre Bragg gratings and frequency converting optical elements require that separate temperature controllers be provided for each of these components. In the light source 10a, however, the temperature controller 22 is thermally coupled to the non-linear material for controlling the temperature of the non-linear material and to the semiconductor laser 12 for modulating the temperature of the semiconductor laser 12.

It has been found that, surprisingly, it is possible to achieve a system having relatively large conversion efficiency while having a fibre Bragg grating 16 and laser 12 emitting laser light over a relatively narrow band width into a temperature sensitive frequency converting optical element 18.

Indeed, it has been found that the requirements for temperature control for the fibre Bragg grating 16 are relatively less severe than the requirements for temperature control for the frequency converting optical element 18. Therefore, it is possible to use relatively narrow reflection bandwidth fibre Bragg gratings 16 that are temperature controlled using the same temperature controller 22 as the temperature controller 22 used to modulate the temperature of the frequency converting optical element 18. The temperature sensitivity of fibre Bragg gratings is typically about 0.01 nm/C. With the light source 10a designed for the correct phase matching temperature of the frequency converting optical element 18 for a pre-determined first frequency, the fibre Bragg grating 16 may also be designed to have the correct central operating frequency at the same temperature. Small variations in the temperature will enable the semiconductor laser 12 to be tuned to operate with the correct narrow bandwidth for relatively high conversion efficiency in the frequency converting optical element 18.

In some embodiments of the invention, the temperature controller 22 includes a heat pump 24 defining a hottest section 28 and a coldest section 26. The heat pump pumps heat from the coldest section 26 to the hottest section 28. The fibre Bragg grating 16 is thermally coupled to one of the hottest and coldest sections 28, 26 and the non-linear material of the frequency converting optical element is thermally coupled to one of the hottest and coldest sections 28 and 26. For example, as seen in FIG. 1, in the light source 10a, the fibre Bragg grating 16 and the non-linear material of the non-linear frequency converting optical element 18 are both thermally coupled to the hottest section 28.

In some embodiments of the invention, the heat pump 24 takes the form of a Pelletier effect element thermally coupled to two heat sinks to improve heat transfer away and into the Pelletier effect element.

In some embodiments of the invention, a control element 23 is connected to the heat pump 24 for modulating the flow of heat carried from the coldest section 26 and to the hottest section 28. The control element 23 may operate in open loop and power the heat pump 24 with a predetermined power. In alternative embodiments of the invention, as shown in FIG. 1, temperature sensors 30 are thermally coupled to the coldest and hottest sections 26 and 28. The temperature sensors 30 are connected to the control element 23 to allow the control element 23 to maintain either predetermined temperatures at the coldest and hottest sections 26 and 28, or to maintain a predetermined temperature difference between the hottest and coldest sections 26 and 28, among other possibilities. This temperature control is achieved by varying the power supplied by the control element 23 to the heat pump 24 through a power supply link 31 interconnecting the control element 23 and the heat pump 24.

The reader skilled in the art will readily appreciate that although the temperature controller 22 presented in this description is mainly used in the context of a light source 10a, it is within the scope of the invention to use the temperature controller 22 to modulate temperatures at coldest and hottest sections 26 and 28 for any other purposes in any other suitable device.

In use, power is provided to the semiconductor laser 12, which generates laser light at the first frequency and outputs the laser light into the optical fibre 14. In some embodiments of the invention, the power supplied to the semiconductor laser 12 may be modulated to modulate the power of the converted light while preserving the efficiency of the light source 10a. This is achievable because the fibre Bragg grating 16 provides feedback to the semiconductor laser and thereby stabilizes the lasing frequency.

Also, modulating the temperature of the fibre Bragg grating 16 using the temperature controller 22 allows to tune the frequency of the transmitted portion of the laser light that passes through the fibre Bragg grating 16. Furthermore, adjusting the temperature of the frequency converting optical element 18 allows to phase match the laser light that passes through the fibre Bragg grating 16 to the frequency converting optical element 18, which allows frequency conversion to occur with a relatively large efficiency.

In addition, since the transmitted portion of the laser light has a relatively narrow bandwidth, conversion may occur over a relatively large distance in the frequency converting optical element 18 since the narrow bandwidth contributes to maintaining phase matching over this relatively large distance. In turn, the converted light may then have a relatively large power.

Figure 2:
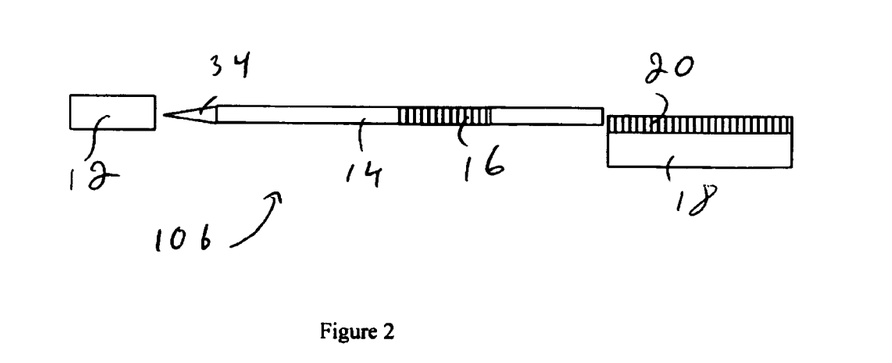
FIG. 2, in a partial schematic view, illustrates a light source in accordance with another embodiment of the present invention.

FIG. 2 illustrates partially a light source 10b in accordance with an alternative embodiment of the invention, the temperature controller 22 not being shown in FIG. 2. Similarly to the light source 10a, the light source 10b includes a semiconductor laser 12. However, instead of having an optical fibre 14 which is fused to the semiconductor laser 12, the optical fibre 14 of the light source 10b includes a fibre input lens 34 formed into the optical fibre for receiving the laser light.

Figure 3:
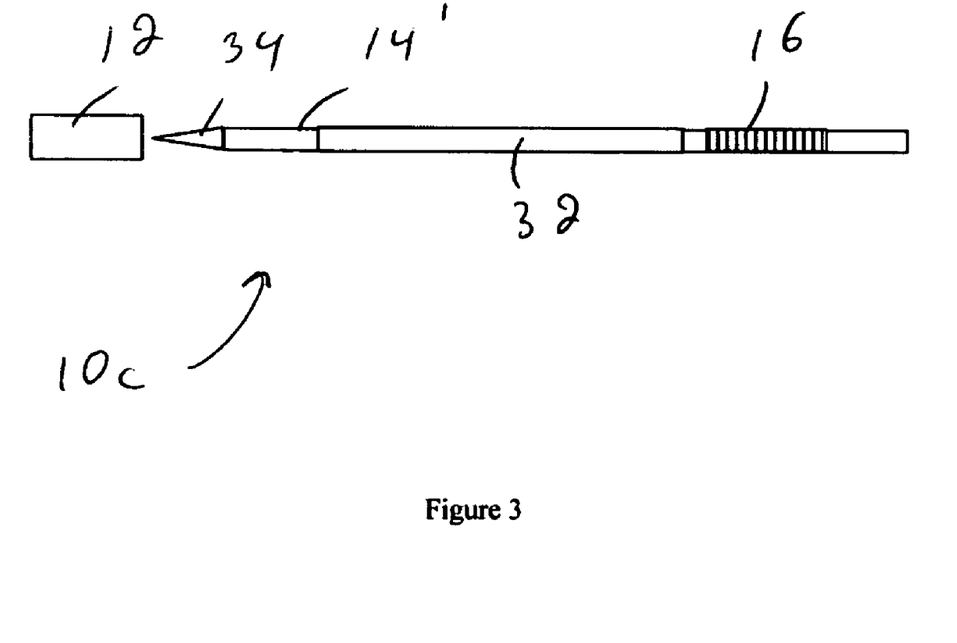
FIG. 3, in a partial schematic view, illustrates a light source in accordance with yet another embodiment of the present invention.

Referring to FIG. 3, in some embodiments of the invention, a light source 10c (only partially shown in FIG. 3) in accordance with another alternative embodiment of the invention includes the laser 12 which outputs laser light into the fibre input lens 34 of an optical fibre 14'. Also, the optical fibre 14' includes a doped fibre section 32 located between the fiber Bragg grating 16 and the semiconductor laser 12. The doped fibre section 32 includes a saturable absorber. For example, the saturable absorber is an Ytterbium doped optical fibre or an Erbium doped optical fibre. The saturable absorber allows to have a relatively long resonant cavity, for example between about 10 mm and about 1000 mm, while providing light having a relatively small bandwidth to the frequency converting optical element 18 (not shown in FIG. 3). The optical fibre 14 may be a single optical fibre having a doped section or an optical fibre 14 in which a doped optical fiber has been spliced. Using a saturable absorber allows to position the fibre Bragg grating further away from the semiconductor laser 12 while keeping a relatively narrow bandwidth for the light output by the light source 10c.

Figure 4:
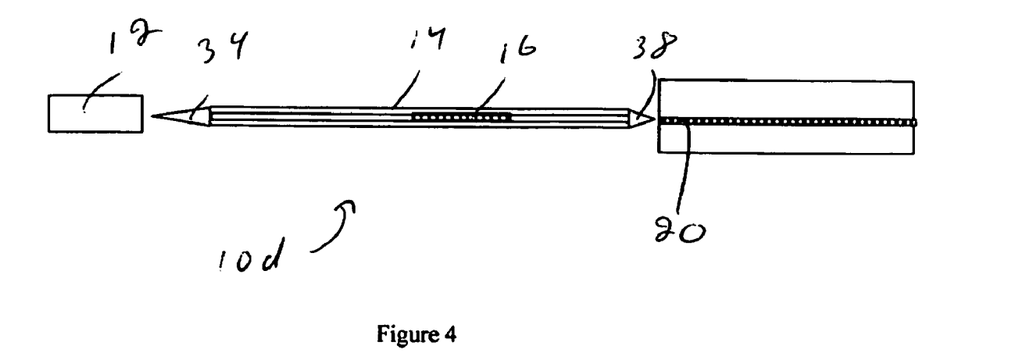
FIG. 4, in a partial schematic view, illustrates a light source in accordance with yet another embodiment of the present invention.

As seen in FIG. 4, which shows partially a light source 10d in accordance with yet another alternative embodiment of the invention, in some embodiments of the invention, the optical fibre 14 is not fused to a frequency converting optical element 18 but, instead, a fibre output lens 38 is formed at an end of the optical fibre 14 opposed to the semiconductor laser 12.

Figure 5:
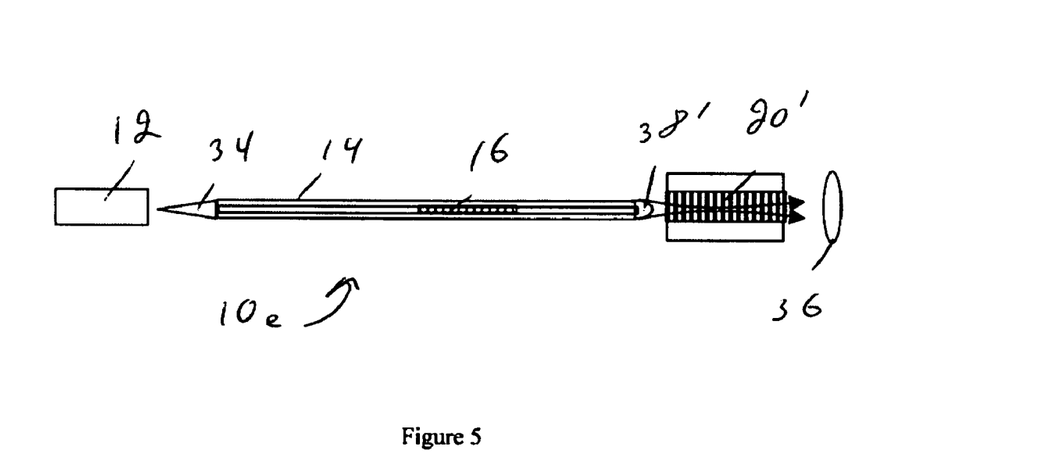
FIG. 5, in a partial schematic view, illustrates a light source in accordance with yet another embodiment of the present invention.

Referring to FIG. 5, which partially shows a light source 10e in accordance with yet another alternative embodiment of the invention, in embodiments of the invention wherein the frequency converting optical element is a bulk periodically poled crystal 20' such as, for example, a periodically poled Lithium-Niobate crystal, an alternative fibre output lens 38' may be formed into the optical fibre 14. The fibre output lens 38' is used in a confocal arrangement to optimally frequency convert the laser light in the periodically poled crystal 20'. Also, the output port 19 then includes a converted light output lens 36 is provided substantially opposed the optical fibre 14 to collimate the converted light emitted by the frequency converting optical element 18.

Figure 6:
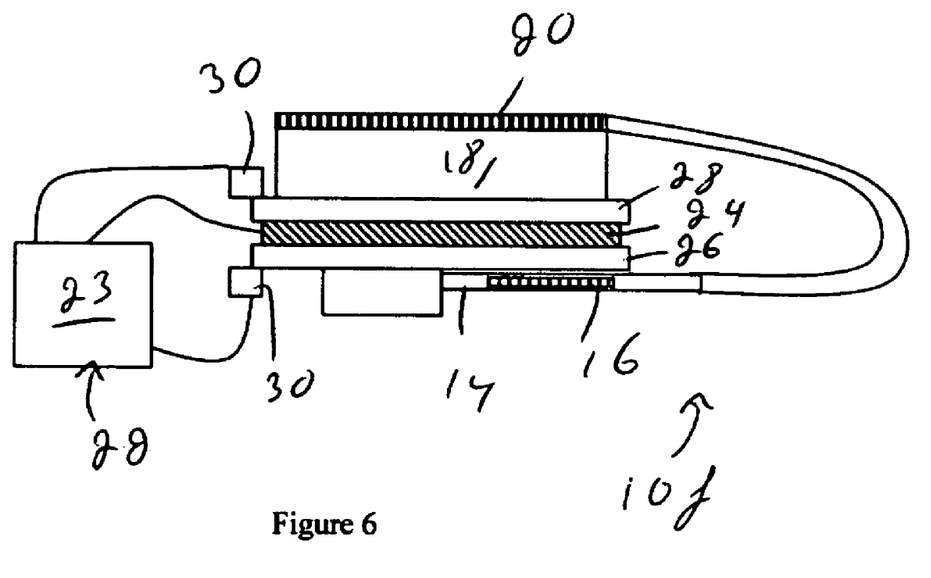
FIG. 6, in schematic view, illustrates a light source in accordance with yet another embodiment of the present invention.

In some embodiments of the invention, it is required to heat the frequency converting optical element 18 while cooling the fibre Bragg grating 16. In these embodiments of the invention, for example in the light source 10f in accordance with yet another alternative embodiment of the invention shown in FIG. 6, the frequency converting optical element 18 may be thermally coupled to the hottest section 28 and the semiconductor laser 12 and the fiber Bragg grating 16 may be thermally coupled to the coldest section 26. Therefore, the temperature controller 22 may simultaneously heat the frequency converting optical element 18 while cooling the fibre Bragg grating 16 to provide a relatively compact and relatively energy efficient light source 10e. Indeed, instead of releasing heat used to cool the fibre Bragg grating 16 into the environment, this heat is used to heat the frequency converting optical element 18.

Figure 7:
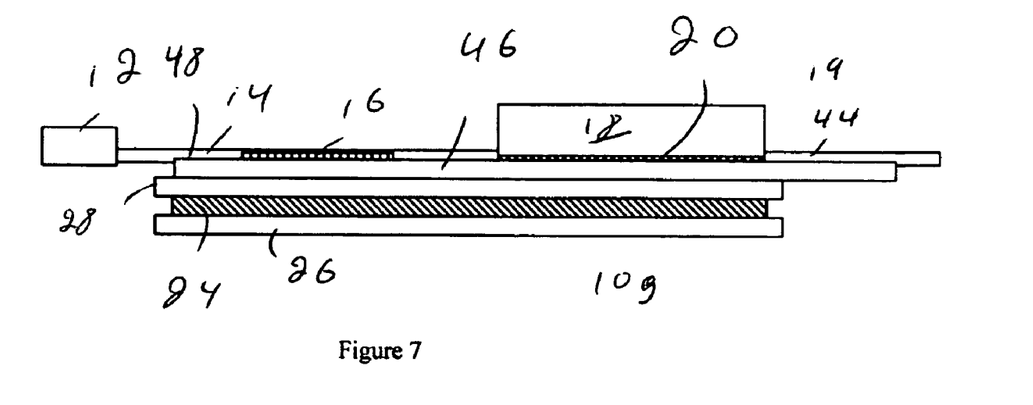
FIG. 7, in a partial schematic view, illustrates a light source in accordance with yet another embodiment of the present invention.

In some embodiments of the invention, as shown partially in FIG. 7, the semiconductor laser 12 is not thermally coupled to the heat pump 24 in a light source 10g in accordance with yet another alternative embodiment of the invention. In addition, the optical fibre 14 and the frequency converting optical element 18 may be secured to a substrate 46 defining a substrate surface 48. The substrate 46 may be any suitable substrate such as, for example, a micro-machined silicon or glass substrate, among other materials. Securing the optical fibre 14 and the frequency converting optical element 18 to the same substrate allows alignment of these two components to ensure that light is transmitted efficiently therebetween.

In addition, FIG. 7 illustrates a light source 10g in which the output port 19 includes an output optical fibre 44 fused or otherwise coupled to the frequency converting optical element 18.

Figure 8:
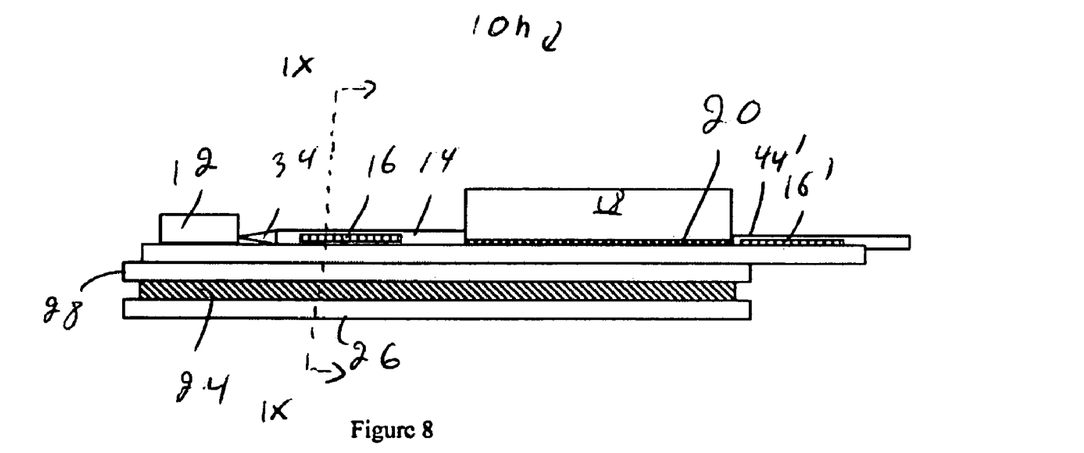
FIG. 8, in a partial schematic view, illustrates a light source in accordance with yet another embodiment of the present invention.

FIG. 8 illustrates partially yet another light source 10h in accordance with yet another alternative embodiment of the invention wherein the semiconductor laser 12 is also secured to the substrate 46. As better seen in FIG. 9, a groove 50 extends into the substrate 46. For example, the groove 50 is a substantially V-shaped groove. The optical fibre 14, which includes a core 40, is supported by the groove 50. For example, the optical fibre 14 is partially inserted into the groove 50.

Figure 9:
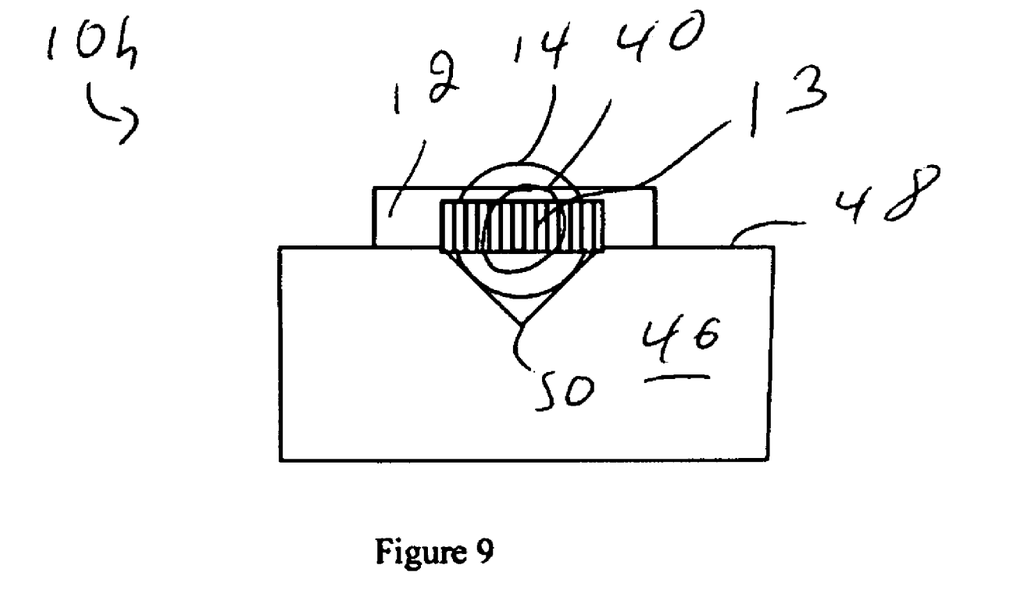

In these embodiments of the invention, the laser output 13 is positioned at a predetermined distance from the support surface 48. The groove 50 is configured and sized such that the core 40 is substantially in register with the laser output 13.

Returning to FIG. 8, the light source 10h includes an output optical fibre 44' in which a fibre Bragg grating 16' is formed. In these embodiments of the invention, the frequency converting optical element 18 may then be located inside the lasing cavity of the light source 10h. Therefore, in these embodiments of the invention, the semiconductor laser 12 receives light reflected from the fibre Bragg grating 16'. To reduce the possibility of damage caused from the backward propagating frequency converted light to the semiconductor laser 12, a relatively narrow band rejecting filter in the form of the fibre Bragg grating 16 is located between the frequency converting optical element 18 and the semiconductor laser 12 to remove, at least in part, the counter-propagating converted light. In these embodiments, the fibre Bragg grating 16 has a rejection frequency of about the frequency of the converted light. Also, any other suitable filter, such as a blazed or tilted grating filter may be used instead of the fibre Bragg grating 16.

Although the present invention has been described hereinabove by way of preferred embodiments thereof, it can be modified, without departing from the spirit and nature of the subject invention as defined in the appended claims.

What is claimed is:

1. A light source, said light source comprising:
   a semiconductor laser for emitting laser light at a first frequency;
   an optical fibre including a fibre Bragg grating, said fibre Bragg grating being optically coupled to said semiconductor laser for
   receiving said laser light;
   reflecting a reflected portion of said laser light towards said semiconductor laser; and
   allowing a transmitted portion of said laser light to pass through said fibre Bragg grating;
   a frequency converting optical element optically coupled to said fibre Bragg grating for receiving said transmitted portion of said laser light and converting at least a fraction of said transmitted portion of said laser light into a converted light having a second frequency different from said first frequency, said fibre Bragg grating having a temperature-dependant reflection spectrum, said frequency converting optical element including a non-linear material for converting said fraction of said transmitted portion of said laser light into said converted light having said second frequency, said second frequency being an harmonic of said first frequency, said non-linear material having a temperature-dependent conversion efficiency;
   an output port optically coupled to said frequency converting optical element for outputting said converted light; and
   a temperature controller thermally coupled to said fibre Bragg grating for modulating a temperature of said fibre Bragg grating so as to modulate said reflection spectrum, said temperature controller being further thermally coupled to said non-linear material for controlling a temperature of said non-linear material, said temperature controller including a heat pump defining a hottest section and a coldest section, said heat pump pumping heat from said coldest section to said hottest section, said fibre Bragg grating being thermally coupled to one of said hottest section and said coldest sections and said non-linear material being thermally coupled to one of said hottest and coldest sections.

2. A light source as defined in claim 1, wherein said fibre Bragg grating and said non-linear material are both thermally coupled to said hottest section.

3. A light source as defined in claim 1, wherein said fibre Bragg grating is thermally coupled to said coldest section and said non-linear material is thermally coupled to said hottest section.

4. A light source as defined in claim 1, wherein said non-linear material includes a periodically poled crystal.

5. A light source as defined in claim 1, wherein said fibre Bragg grating has a reflection bandwidth of less than about 0.3 nm.

6. A light source as defined in claim 5, wherein said laser has a bandwidth of less than about 0.01 nm.

7. A light source as defined in claim 1, wherein said optical fibre defines a resonant cavity extending between said fibre Bragg grating and said semiconductor laser, said resonant cavity having a cavity length of less than about 10 mm.

8. A light source as defined in claim 1, wherein said temperature controller is thermally coupled to said semiconductor laser for controlling a temperature of said semiconductor laser.

9. A light source as defined in claim 1, wherein said fibre Bragg grating has a reflectivity larger than about 30 percent at said first frequency.

10. A light source as defined in claim 1, further comprising a substrate, said substrate defining a support surface, said substrate including a substantially elongated groove extending substantially inwardly into said support surface, said semiconductor laser being mechanically coupled to said support surface, said optical fibre having a portion thereof located within said groove, wherein
said optical fibre includes a core;
said semiconductor laser includes a laser output for outputting said laser light, said laser output being positioned at a predetermined distance from said support surface;
said groove is configured and sized such that said core is substantially in register with said laser output.

11. A light source, said light source comprising:
a semiconductor laser for emitting laser light at a first frequency;
an optical fibre including a fibre Bragg grating said fibre Bragg grating being optically coupled to said semiconductor laser for
receiving said laser light;
reflecting a reflected portion of said laser light towards said semiconductor laser; and
allowing a transmitted portion of said laser light to pass through said fibre Bragg grating;
a frequency converting optical element optically coupled to said fibre Bragg grating for receiving said transmitted portion of said laser light and converting at least a fraction of said transmitted portion of said laser light into a converted light having a second frequency different from said first frequency said fibre Bragg grating having a temperature-dependant reflection spectrum;
an output port optically coupled to said frequency converting optical element for outputting said converted light;
a temperature controller thermally coupled to said fibre Bragg grating for modulating a temperature of said fibre Bragg grating so as to modulate said reflection spectrum said temperature controller being provided for adjusting said temperature of said fibre Bragg granting to obtain a predetermined reflection spectrum; and
a saturable absorber located between said semiconductor laser and said fibre Bragg grating, said saturable absorber having a length of between about 100 mm and 1000 mm.

12. A light source as defined in claim 11, wherein said temperature controller is provided for adjusting said temperature of said fibre Bragg grating to obtain a predetermined reflection spectrum.

13. A light source as defined in claim 11, wherein said frequency converting optical element includes a non-linear material for converting said fraction of said transmitted portion of said laser light into said converted light having said second frequency, said second frequency being an harmonic of said first frequency.

14. A light source as defined in claim 13, wherein said non-linear material has a temperature-dependent conversion efficiency.

15. A light source as defined in claim 14, wherein said temperature controller is thermally coupled to said non-linear material for controlling a temperature of said non-linear material.

16. A light source as defined in claim 15, wherein said temperature controller includes a heat pump defining a hottest section and a coldest section, said heat pump pumping heat from said coldest section to said hottest section, said fibre Bragg grating being thermally coupled to one of said hottest section and said coldest section and said non-linear material being thermally coupled to one of said hottest and coldest section.

17. A light source as defined in claim 12, wherein said frequency converting optical element includes a semiconductor laser.

18. A light source as defined in claim 11, wherein said saturable absorber is selected from the set consisting of Ytterbium doping said optical fibre and Erbium doping said optical fibre.

19. A light source as defined in claim 11, wherein said optical fibre is a polarization maintaining optical fibre.

20. A light source as defined in claim 11, wherein said semiconductor laser is a modulatable semiconductor laser having a modulatable laser light power.

* * * * *